United States Patent
Emeghara et al.

(10) Patent No.: US 12,365,247 B2
(45) Date of Patent: Jul. 22, 2025

(54) CONTROL SYSTEM FOR COMPENSATING FOR CURRENT SENSOR OFFSET/GAIN ERRORS

(71) Applicant: BorgWarner Inc., Auburn Hills, MI (US)

(72) Inventors: Chikezie M. Emeghara, Cookeville, TN (US); Hassan H. Eldeeb, Carmel, IN (US); Siddharth Ballal, Fishers, IN (US); Caleb W. Secrest, Noblesville, IN (US)

(73) Assignee: BorgWarner Inc., Auburn Hills, MI (US)

( * ) Notice: Subject to any disclaimer, the term of this patent is extended or adjusted under 35 U.S.C. 154(b) by 179 days.

(21) Appl. No.: 18/200,087

(22) Filed: May 22, 2023

(65) Prior Publication Data

US 2024/0391324 A1  Nov. 28, 2024

(51) Int. Cl.
| | |
|---|---|
| *H02P 1/00* | (2006.01) |
| *B60L 3/00* | (2019.01) |
| *B60L 15/20* | (2006.01) |
| *B60L 53/20* | (2019.01) |
| *G01R 19/25* | (2006.01) |

(52) U.S. Cl.
CPC ............. *B60L 3/0038* (2013.01); *B60L 15/20* (2013.01); *B60L 53/20* (2019.02); *G01R 19/2506* (2013.01); *B60L 2240/429* (2013.01)

(58) Field of Classification Search
CPC .......... H02P 27/06; H02P 31/00; G05B 15/02
See application file for complete search history.

(56) References Cited

U.S. PATENT DOCUMENTS

2023/0099305 A1* 3/2023 Howlett, III ........ H02J 7/00714
307/9.1

OTHER PUBLICATIONS

Min-Sik Yoo, Sang Woo Park, Hyun-Jun Lee and Young-Doo Yoon, Off-line Compensation Method for Current Scaling Gains in AC Motor Drive Systems with Three-phase Current Sensors, 10th International Conference on Power Electronics-ECCE Asia, May 27-30, 2019 (6 pages).

Min-Sik Yoo, Sang-Woo Park, Hyun-Jun Lee and Young-Doo Yoon, Offline Compensation Method for Current Scaling Gains in AC Motor Drive Systems With Three-Phase Current Sensors, IEEE Transactions on Industrial Electronics, vol. 68, No. 6, Jun. 2021 (9 pages).

Manas Ranjan Jena, Kanungo Barada Mohanty, Bhanu Pratap Behera, and Anindya Bharatee, Digital Implementation of Single Current Sensor-Based IPMSM Drive With Sampling Error Delay Compensation, IEEE Transactions on Instrumentation and Measurement, vol. 71, 2022 (12 pages).

* cited by examiner

*Primary Examiner* — Karen Masih
(74) *Attorney, Agent, or Firm* — Reising Ethington P.C.

(57) ABSTRACT

A control system configured to control an electric motor of an electric vehicle (EV) includes a current sensor offset detector that determines an offset of one or more current sensors; a gain compensator that determines a second order harmonic component in d- and q-axis currents due to gain errors in one or more sensors; and a controller that generates a control signal that compensates for the offset or gain error mismatch of the current sensor(s).

11 Claims, 7 Drawing Sheets

CONTROL SYSTEM FOR COMPENSATING FOR CURRENT SENSOR OFFSET/GAIN ERRORS

TECHNICAL FIELD

The present application relates to vehicular sensors and, more particularly, to current sensors used with electric vehicles (EVs).

BACKGROUND

Vehicles use a significant number of sensors to carry out vehicle functionality. Current sensors can be used to measure phase current(s) and, based on output from the sensors, a control system can generate control signals that regulate traction motors of an EV. Sensors typically used in vehicular applications can have an offset and/or gain error that introduces an error into the control system. Other sensors exist without such an offset or gain error. But the cost of using more accurate sensors can be prohibitive. It would be helpful to determine and compensate for the inherent gain/offset included in sensors.

SUMMARY

In one implementation, a control system configured to control an electric motor of an electric vehicle (EV) includes a current sensor offset detector that determines an offset of one or more current sensors; a gain compensator that determines a second order harmonic component in d- and q-axis currents due to gain errors in one or more sensors; and a controller that generates a control signal that compensates for the offset or gain error mismatch of the current sensor(s).

In another implementation, a control system configured to control an electric motor of an EV includes an electric motor included in the EV; a three-phase inverter electrically coupled to the electric motor; a vehicle battery electrically coupled to the inverter; and a controller including a current sensor offset detector that determines a second order harmonic component in d- and q-axis currents due to gain error in one or more current sensors; a gain compensator that determines a gain of the one or more sensors, such that the controller generates a control signal that compensates for the offset or gain of the current sensor(s).

In yet another implementation, a method of controlling an electric motor of an EV includes receiving a control signal for the electric motor; determining an offset for one or more current sensors; determining a second order harmonic component in d- and q-axis currents due to gain errors in the one or more current sensors; modifying the control signal to compensate for the second order harmonic component in d- and q-axis currents due to gain errors, the offset, or both the gain and offset; and communicating the modified control signal to the electric motor of the EV.

DETAILED DESCRIPTION

A control system or controller can determine and compensate for offset and/or gain errors exhibited by current sensors. For instance, a vehicle can include current sensors that provide feedback to a controller. The current sensors can be used to determine an angular position of a current vector relative to a stator in an electric motor or electric machine. The controller can determine, without knowledge of the system in which a current sensor is used, the gain and offset of the current sensor, and compensate for the determined gain/offset when generating a control signal. For example, current sensors can be used to determine an angular position of a current vector of an electric motor; the offset/gain of the sensors can be compensated for without knowledge of the actual angular position of the shaft. The controller can also compensate for the second order harmonic component in the synchronous reference frame current components ($I_{dq0}$).

Vehicular current sensors typically have gain and offset errors. Apart from the gain and offset errors, the current sensors also have some variability with respect to their performance. As current sensors age and are exposed to environmental factors, such as heat, their performance can change. If the gain and offset errors of the current sensors are not determined, the system in which the sensor is used can perform sub-optimally. For instance, the current sensors can facilitate torque pulsation at the output shaft of an electric motor that propels the vehicle. Or the current sensors can receive larger levels of electrical current than the sensors are rated to receive.

Figure 1:
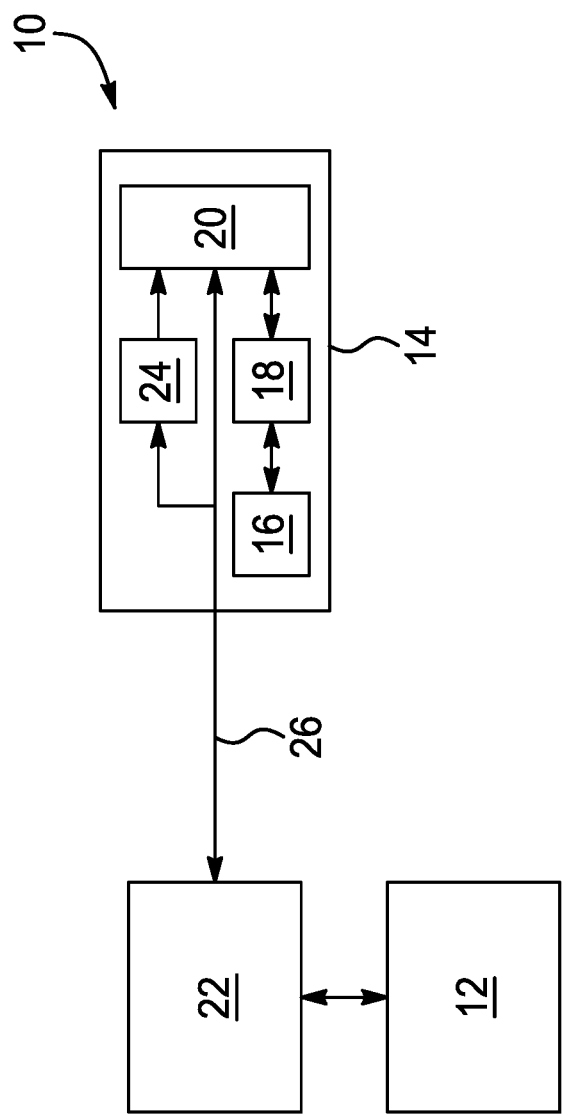
FIG. 1 is a block diagram depicting an implementation of an electric vehicle (EV)
Figure 2:
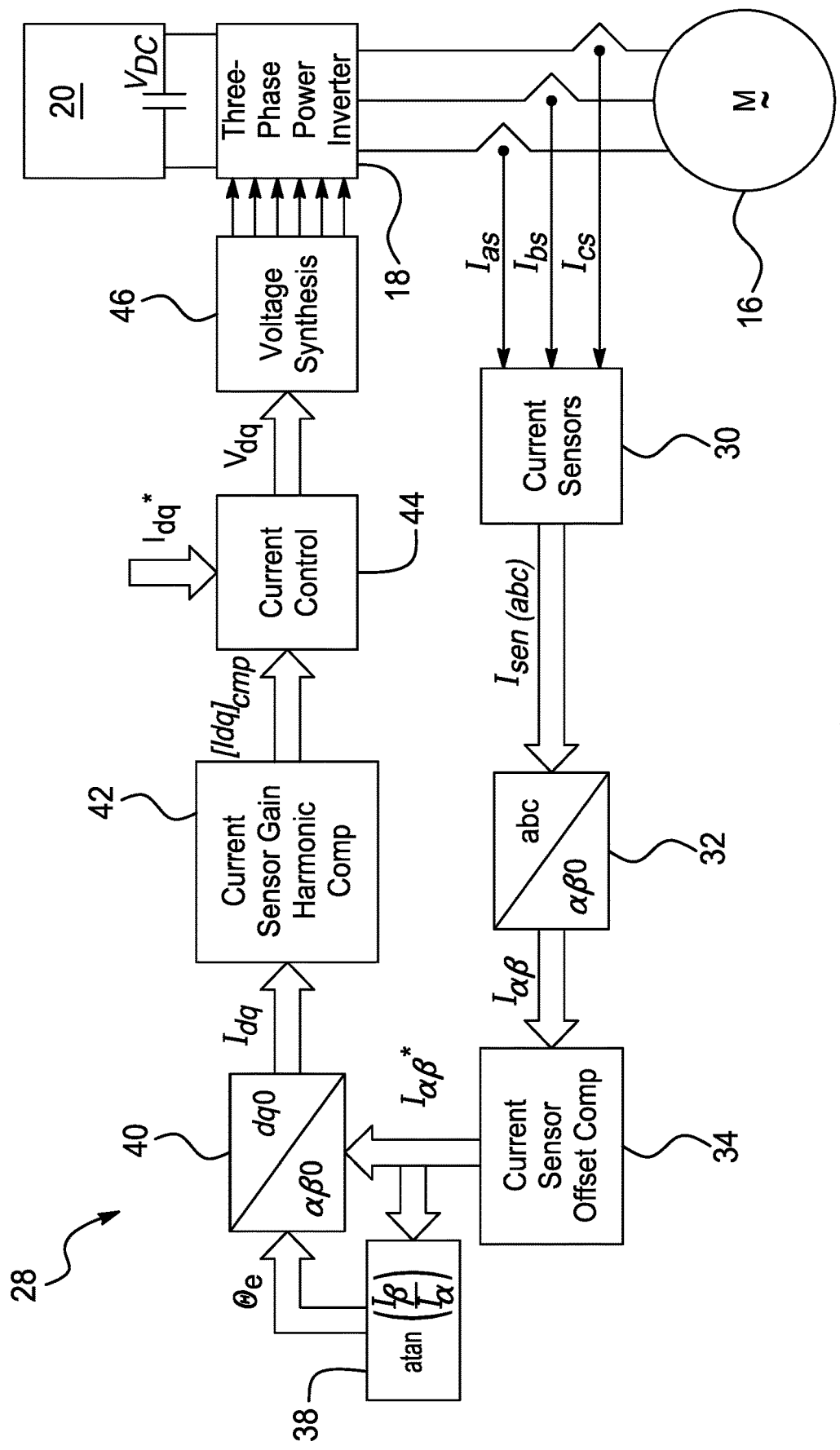
FIG. 2 is a block diagram depicting an implementation of a control system that determines and compensates for offset and/or gain errors exhibited by current sensors.
Figure 3:
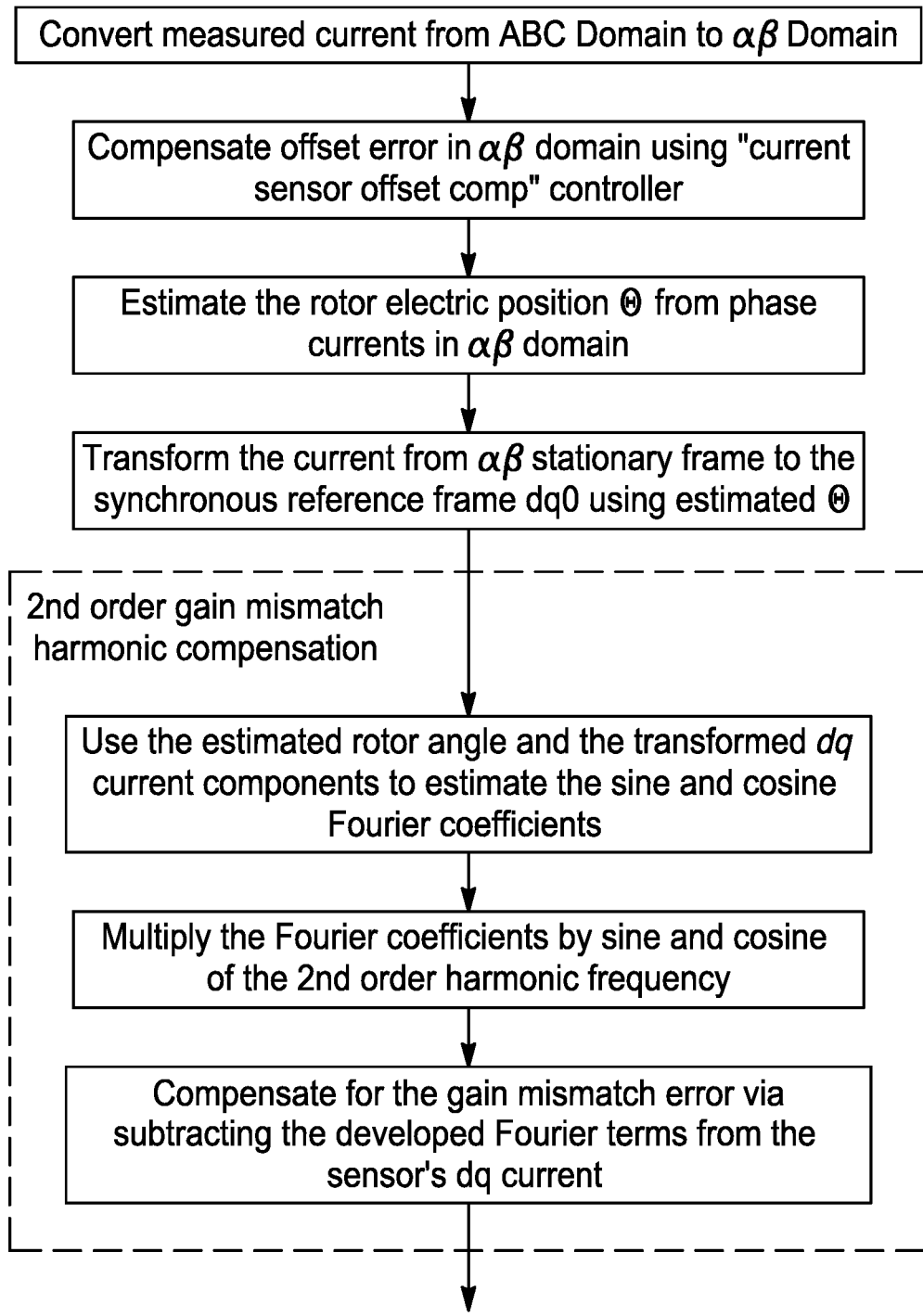
FIG. 3 is a flow chart depicting an implementation of a method of determining and compensating for offset and/or gain errors exhibited by current sensors.

Turning to FIG. 1, an implementation of an electrical system 10 is shown including an electrical grid 12 and an electric vehicle (EV) 14 that can either receive electrical power from or provide electrical power to the grid 12. The electrical grid 12 can include any one of a number of electrical power generators and electrical delivery mechanisms. Electrical generators (not shown) create AC electrical power that can then be transmitted a significant distance away from the electrical generator for residential and commercial use. The electrical generator can couple with the electrical grid 12 that transmits the AC electrical power from the electrical generator to an end user, such as a residence or business. As the AC electrical power is provided to the electrical grid 12, the electrical power can exist at a relatively high voltage so that it can be communicated relatively long distances. Once the electrical power reaches a location where it is intended to be used, electrical transformers (not shown) can be used to reduce the voltage level before ultimately being provided to a residence or business. In one implementation, the voltage level of AC electrical power used is 360-510 volts RMS alternating current three-phase, 50-60 hz. However, this voltage range can be different.

The EV 14 can include an electric motor 16 that wholly, or at least partially, propels the vehicle. A three-phase inverter 18 can be electrically coupled to an EV battery 20 and the electric motor 16. The inverter can receive DC electrical power from the EV battery 20 and invert the DC electrical power into three-phase AC electrical power before supplying the AC electrical power to the electric motor 16. The amount of voltage supplied by the EV battery to the electric motor can vary by application. The term "electric vehicle" or "EV" can refer to vehicles that are propelled, either wholly or partially, by electric motors. EV can refer to electric vehicles, plug-in electric vehicles, hybrid electric vehicles, and battery-powered vehicles.

An EV charging station, referred to here as a DC fast charger 22, can receive AC electrical power from the grid 12, rectify the AC electrical voltage into DC electrical power, and provide the DC electrical power to the EV 14. The DC fast charger 22 can be geographically fixed, such as a charging station located in a vehicle garage or in a vehicle parking lot. The DC fast charger 22 can include an input terminal that receives the AC electrical power from the grid 12 and communicates the AC electrical power to the EV battery 20 directly, bypassing an on-board vehicle battery charger 24 included on the EV 14. An electrical cable 26 can detachably connect with an electrical receptacle on the EV 14 and electrically link the DC fast charger 22 with the EV 14 so that DC electrical power can be communicated between the DC fast charger 22 and the EV battery 20. One type of DC fast charging may be referred to as Level 3 EV charging, considered to be 60-350 kW. However, other charging standards and power levels are possible with the structure and functionality disclosed here. The EV battery 20 can supply DC electrical power controlled by power electronics to the electric motor 16 that propels the EV 14. The EV battery 20 or batteries are rechargeable. Examples of the battery include lead-acid batteries, nickel cadmium (NiCd), nickel metal hydride, lithium-ion, and lithium polymer batteries. However, battery technology is evolving and other chemistries and/or voltages may be used. A typical range of vehicle battery voltages can range from 100 to 1000V of DC electrical power (VDC). A control system 28, implemented as computer-readable instructions executable by the microprocessor, can be stored in non-volatile memory and called on to monitor current sensors as well as generate control signals. This will be discussed in more detail below.

Figure 4:
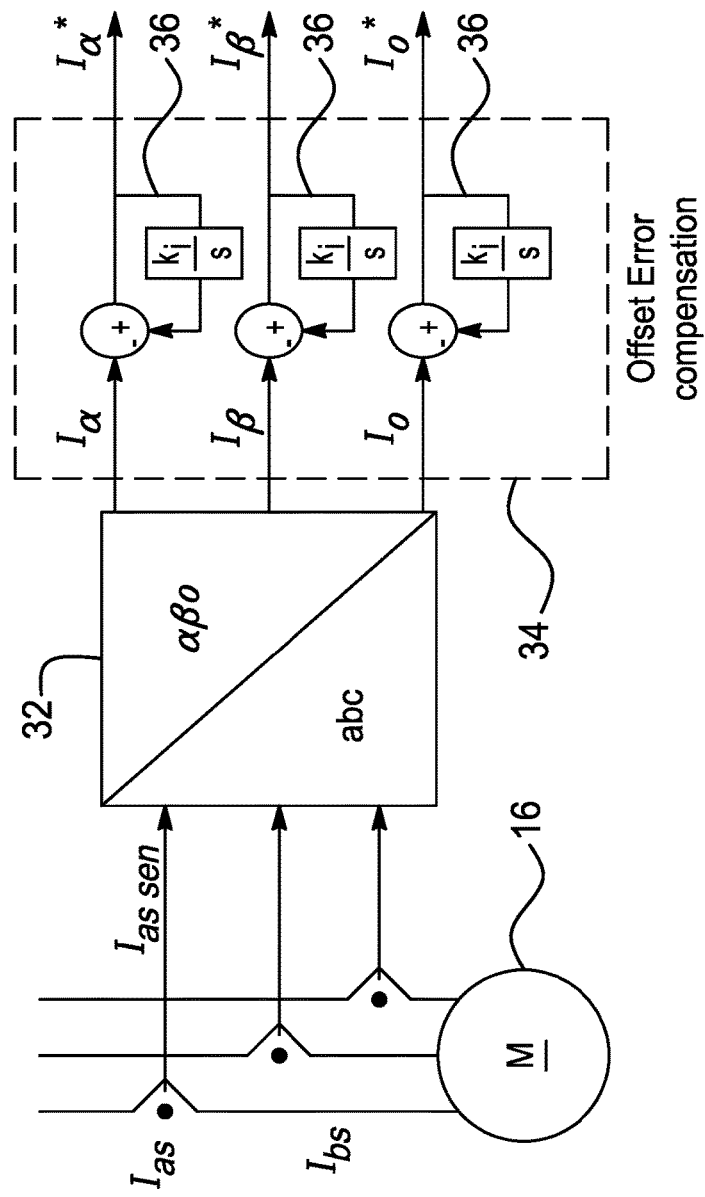
FIG. 4 is a block diagram depicting a portion of an implementation of a control system that determines and compensates for offset and/or gain errors exhibited by current sensors.
Figure 5:
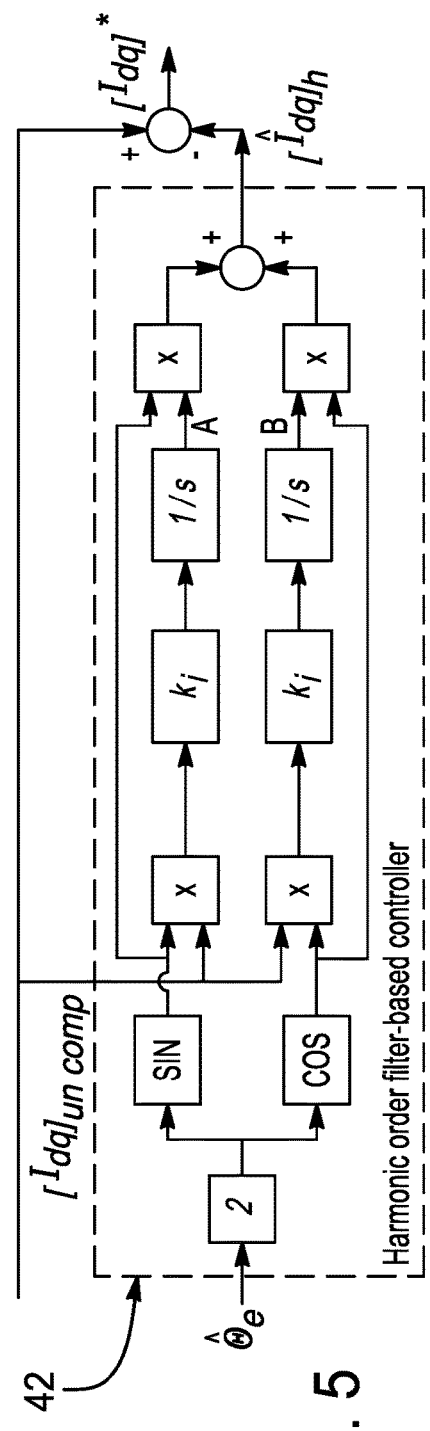
FIG. 5 is a block diagram depicting a portion of an implementation of a control system that determines and compensates for offset and/or gain errors exhibited by current sensors.

Turning to FIGS. 2-5, an implementation of the control system 28 is shown as well as a flow chart describing functionality carried out by the control system 28 in a series of method steps. The control system 28 is electrically coupled to the electric motor 16 and may be implemented using a microprocessor and electrically coupled with the three-phase power inverter 18. Current sensors 30 are electrically coupled to leads of the electric motor 16. The current sensors 30 can monitor current flowing from the inverter 18 to the electric motor 16 and generate an output signal $I_{sen}(abc)$ indicating an electrical current level. The output signal can be converted from abc domain to alpha beta ($\alpha\beta0$) stationary reference domain ($I_{\alpha\beta}$) at block 32. This is shown in FIG. 4 in more detail. Control system 28 can then adjust $I_{\alpha\beta}$ to compensate for the measured offset or shift off of center at a current sensor offset compensation block 34. Integral controllers 36 can receive $I_\alpha$, $I_\beta$, and $I_0$, which include offset errors from the current sensors 30. The integral controllers 36 can include k as a gain value and s as a Laplace differential operator. The signals $I_\alpha$, $I_\beta$, and $I_0$, can be converted by the current sensor offset block 34 into the output signals into signals $I_\alpha^*$, $I_\beta^*$, and $I_0^*$, respectively, that no longer include the offset errors for each current sensor 30. The output signals $I_\alpha^*$, $I_\beta^*$, and $I_0^*$ can be provided to a current vector angular position calculating block 38 and an $\alpha\beta0/dq0$ conversion block 40. The current vector angular position calculating block 38 can calculate the angular position ($\theta_e$) of the current vector of the electric motor 16 using the phase currents in the stationary reference domain $\alpha\beta0$. The estimation of the angular position of the current vector ($\theta_e$) can be generated without a sensor reading of the actual angular position of the output shaft ($\theta$). The output from block 38 is supplied to the $\alpha\beta0/dq0$ conversion block 40 along with signals $I_\alpha^*$, $I_\beta^*$, and $I_0^*$, respectively, that no longer include the offset errors corresponding to the offset errors of each current sensor 30. The $\alpha\beta0/dq0$ conversion block 40 can use the calculated angular position of the current vector ($\theta_e$) and signals $I_\alpha^*$, $I_\beta^*$, and $I_0^*$, that no longer include the offset errors corresponding to offset errors of each current sensor 30, to generate the synchronous reference frame current ($I_{dq}$).

The synchronous reference frame current ($I_{dq}$) can be supplied to the harmonic compensation block 42. The block 42 is shown in more detail in FIG. 5. At block 42, the angular position of the current vector ($\theta_e$) and the synchronous reference frame current ($I_{dq}$) can be used to determine sine and cosine Fourier coefficients. The Fourier coefficients can be multiplied by sine and cosine of the second order harmonic of the angular position of the current vector. The control system 28 can then compensate for second order harmonic errors due to gain error in the current sensors 30 by subtracting the resulting Fourier terms from the synchronous reference frame ($I_{dq}$). The output of the harmonic compensation block 42 is a synchronous reference frame current ($I_{dq}^*$) having the second order harmonic component removed such that the oscillatory terms are omitted. The output is supplied to a current control block 44. The current control block 46 can receive a commanded current ($I_{dq}^{**}$) and the synchronous reference frame current ($I_{dq}^*$) having an estimated second order harmonic component removed to provide $V_{dq}$ to the voltage synthesis block 46. Block 46 can then provide a command signal to the inverter 18.

Figure 6:
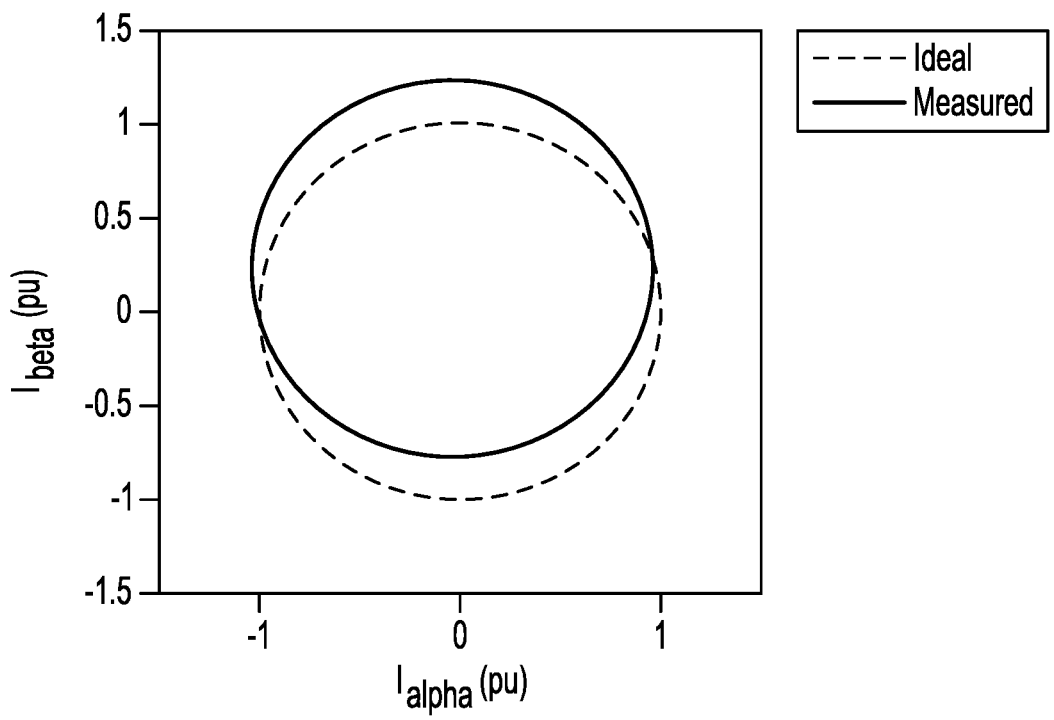
FIG. 6 is a graph depicting offset measurements relating to current sensors.
Figure 7:
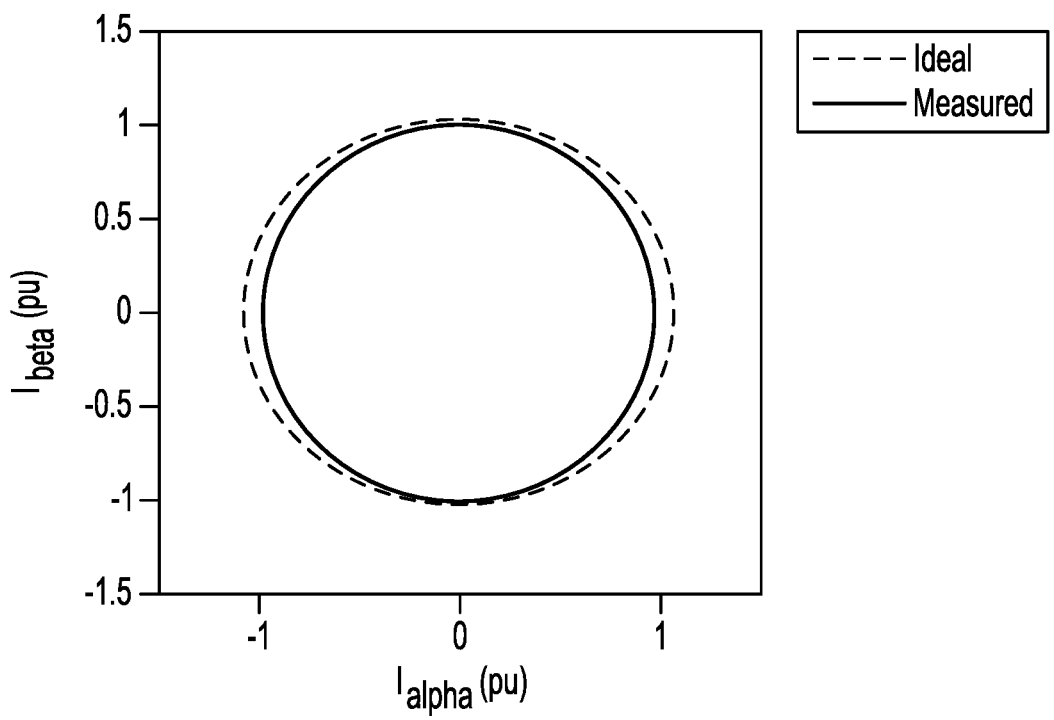
FIG. 7 is a graph depicting gain measurements relating to current sensors.

The output signal $I_{\alpha\beta0}$ in one embodiment is shown in FIG. 6. An ideal current sensor (without offset error) has an alpha-beta current image that is a perfect unit circle. However, measured DC parasitic offset in a current sensor exhibits a non-circular unit circle that is shifted off center (0,0) to another point. The measured gain is shown in FIG. 7. An ideal current sensor will have a perfect unit circle. In contrast, gain error can distort the unit circle such that it appears as an ellipse as the magnitude of the alpha current ($I_\alpha$) and beta current ($I_\beta$) can be unequal. Such an imbalance can create a second order oscillatory component in the synchronous reference frame current ($I_{dq}$).

Figure 8:
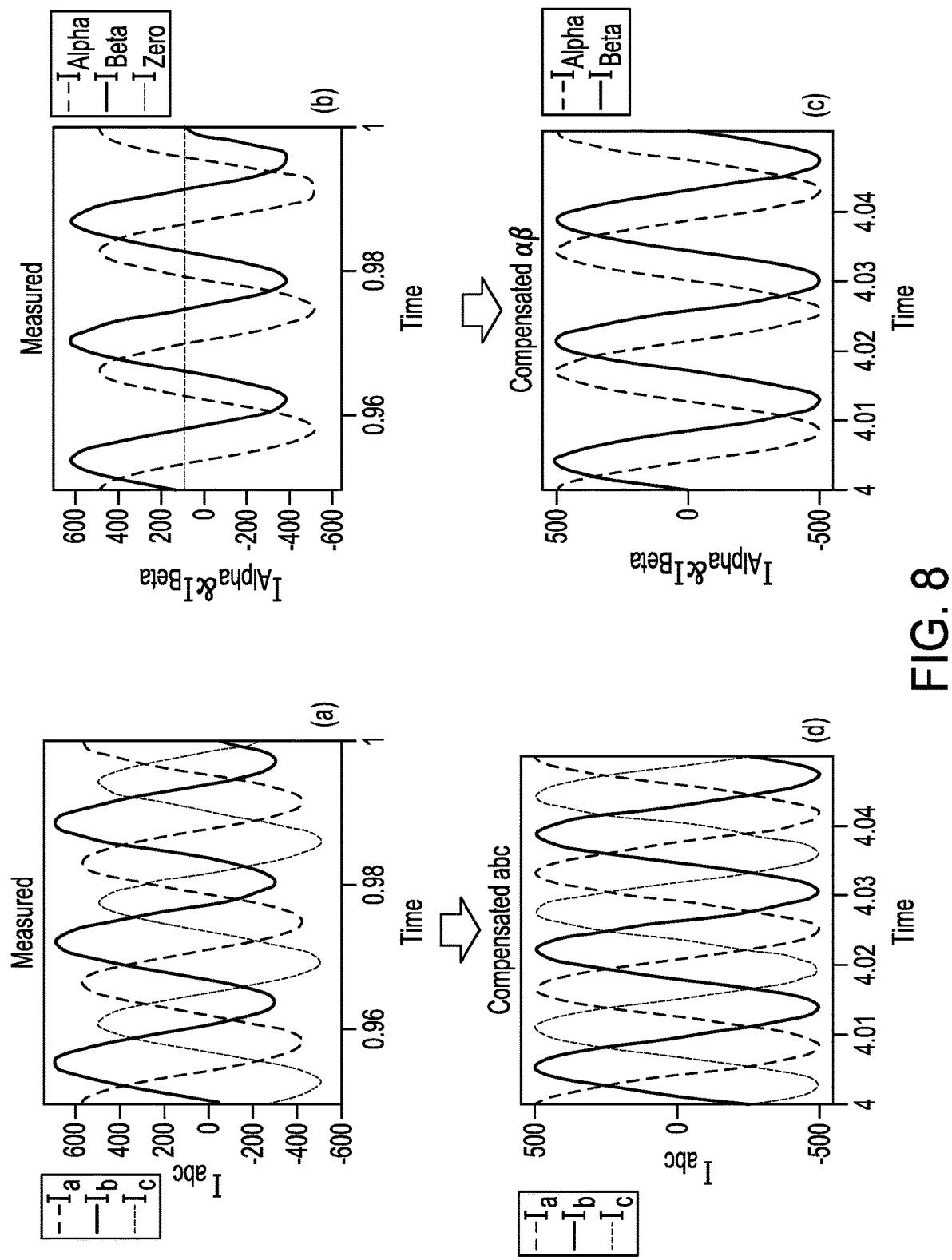
FIG. 8 includes graphs depicting current sensor performance with an offset mismatch controller.
Figure 9:
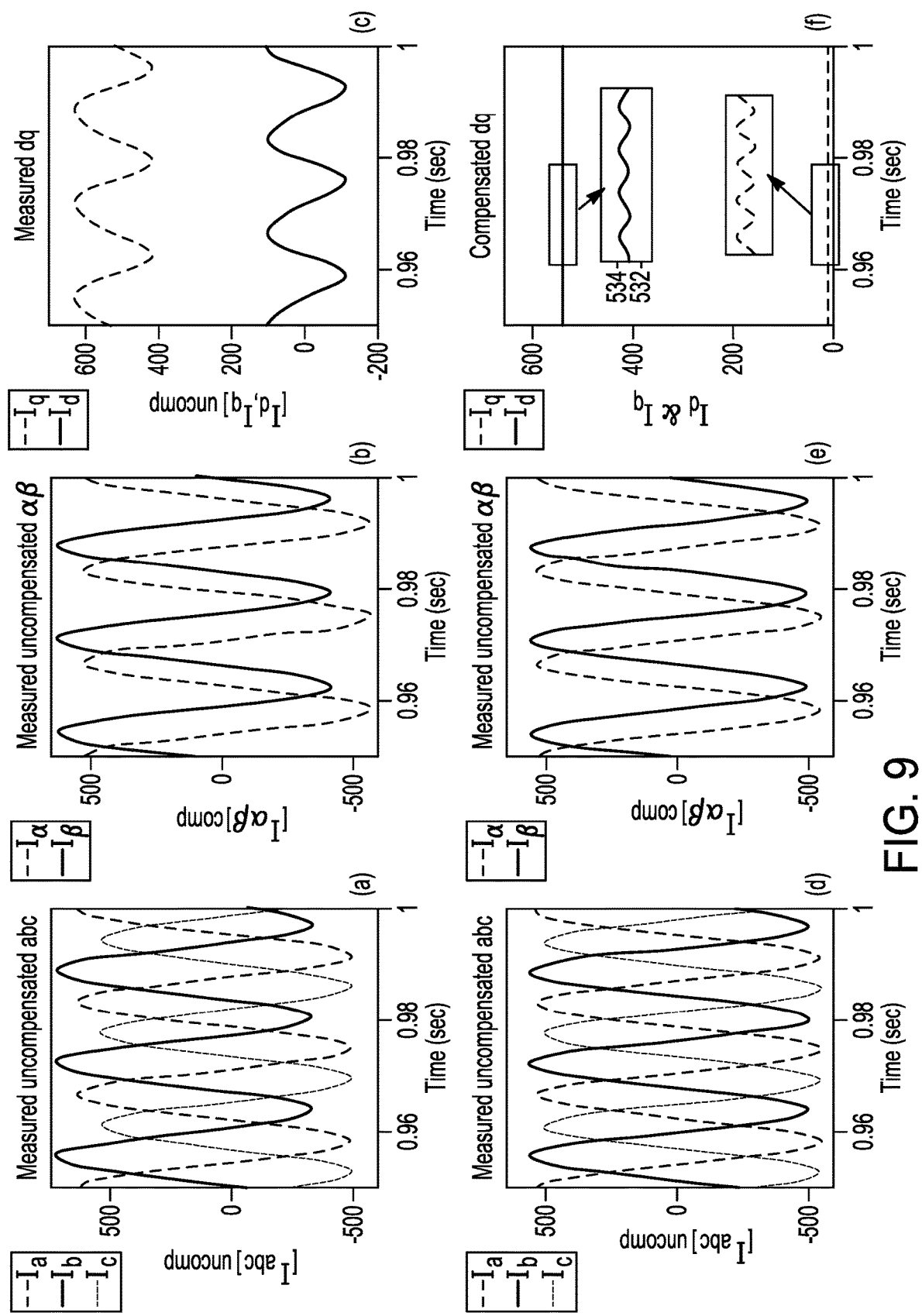
FIG. 9 includes graphs depicting current sensor performance with the gain and offset mismatch controllers.

FIGS. 8-9 involve measured current from the current sensors 30. FIG. 8a depicts the measured current in the abc domain with a DC offset mismatch. FIG. 8b depicts the transformed measured current into the stationary reference frame ($\alpha\beta0$), and the mismatch DC offset effect depicted as an offset in the alpha-beta currents ($I_\alpha$ and $I_\beta$). The output from the current sensor offset block can then be provided to an angular position determining block and a conversion block. FIG. 8c depicts compensated alpha and beta currents ($I_\alpha^*$, $I_\beta^*$) while FIG. 8d depicts the transformed compensated current in abc domain; the current is balanced. FIG. 9a depicts a measured current of the current sensors 30 in the abc domain with a gain and offset mismatch. FIG. 9b depicts the transformed current into stationary reference frame (dq0), while FIG. 9c depicts a mismatch DC offset effect as a second order harmonic component in the dq currents ($I_{dq}$). FIGS. 9d-f depict the currents after compensation by the control system 28.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. A control system configured to control an electric motor of an electric vehicle (EV), comprising:
    a current sensor offset detector that determines an offset of one or more current sensors;
    a gain compensator that determines a second order harmonic component in d- and q-axis currents due to gain errors in one or more sensors; and
    a controller that generates a control signal that compensates for the offset or gain error mismatch of the current sensor(s).

2. The control system recited in claim 1, wherein the controller determines the offset or the second order harmonic component in d- and q-axis currents due to gain errors without knowledge of an angular position of an output shaft of the electric motor.

3. The control system recited in claim 1, wherein the control signal is provided to an inverter electrically coupled to the electric motor.

4. The control system recited in claim 1, wherein controller compensates for the second order harmonic component.

5. A control system configured to control an electric motor of an electric vehicle (EV), comprising:
    an electric motor included in the EV;
    a three-phase inverter electrically coupled to the electric motor;
    a vehicle battery electrically coupled to the inverter; and
    a controller including a current sensor offset detector that determines a second order harmonic component in d- and q-axis currents due to gain error in one or more current sensors; a gain compensator that determines a gain of the one or more sensors, wherein the controller generates a control signal that compensates for the offset or gain of the current sensor(s).

6. The control system recited in claim 5, wherein the controller determines the offset or gain without knowledge of an angular position of an output shaft of the electric motor.

7. The control system recited in claim 5, wherein the controller compensates for a second order harmonic component.

8. A method of controlling an electric motor of an electric vehicle (EV), comprising:
    (a) receiving a control signal for the electric motor;
    (b) determining an offset for one or more current sensors;
    (c) determining a second order harmonic component in d- and q-axis currents due to gain errors in the one or more current sensors;
    (d) modifying the control signal to compensate for the second order harmonic component in d- and q-axis currents due to gain errors, the offset, or both the gain and offset; and
    (e) communicating the modified control signal to the electric motor of the EV.

9. The method recited in claim 8, wherein steps (b) and (c) are carried out without knowing an angular position of an output shaft of the electric motor.

10. The method recited in claim 8, wherein step (d) compensates for a second order harmonic component.

11. The method recited in claim 8, further comprising the step of providing the control signal to an inverter electrically coupled to the electric motor.

* * * * *